US012754255B2

(12) United States Patent
Abeywickrama et al.

(10) Patent No.: US 12,754,255 B2
(45) Date of Patent: Oct. 6, 2026

(54) MONITORING A TRANSFORMER COMPRISING A TAP CHANGER

(71) Applicant: Hitachi Energy Ltd, Zürich (CH)

(72) Inventors: Nilanga Abeywickrama, Västerås (SE); Tord Bengtsson, Västerås (SE); Cecilia Forssen, Västerås (SE); Joachim Schiessling, Enköping (SE)

(73) Assignee: Hitachi Energy Ltd, Zürich (CH)

( * ) Notice: Subject to any disclaimer, the term of this patent is extended or adjusted under 35 U.S.C. 154(b) by 0 days.

(21) Appl. No.: 18/837,434

(22) PCT Filed: Feb. 8, 2023

(86) PCT No.: PCT/EP2023/053131
§ 371 (c)(1),
(2) Date: Aug. 9, 2024

(87) PCT Pub. No.: WO2023/156276
PCT Pub. Date: Aug. 24, 2023

(65) Prior Publication Data

US 2025/0110190 A1 Apr. 3, 2025

(30) Foreign Application Priority Data

Feb. 17, 2022 (EP) .................................... 22157343

(51) Int. Cl.
*G01R 31/62* (2020.01)
*H01F 29/02* (2006.01)

(52) U.S. Cl.
CPC ............. *G01R 31/62* (2020.01); *H01F 29/02* (2013.01)

(58) Field of Classification Search
CPC ................................ G01R 31/62; H01F 29/02
USPC .......................................................... 324/547
See application file for complete search history.

(56) References Cited

U.S. PATENT DOCUMENTS 10,224,718 B2 * 3/2019 Sun ......................... H02J 50/10
10,473,707 B2 11/2019 Bengtsson et al.
2008/0129524 A1 * 6/2008 Kondo .................... H01F 29/04
340/665
2012/0306471 A1 * 12/2012 Green ................. H01H 9/0016
323/355

(Continued)

FOREIGN PATENT DOCUMENTS

CN 109643889 A 4/2019
KR 2015037267 A * 4/2015 ............. G01R 31/62
WO WO-2021025612 A1 * 2/2021 ........... G01R 31/343

OTHER PUBLICATIONS

International Search Report and Written Opinion of the International Searching Authority, International Application No. PCT/EP2023/053131, mailed May 8, 2023, 15 pages.

(Continued)

*Primary Examiner* — Arleen M Vazquez
*Assistant Examiner* — Robert P Alejnikov, Jr.
(74) *Attorney, Agent, or Firm* — Sage Patent Group

(57) ABSTRACT

A method for monitoring a transformer comprising a tap changer, wherein extracted information comprises a circulating current amplitude and/or a circulating current time covering at least a part of the tap change operation represented by at least one current difference waveform, and/or a transition current time covering at least a part of the tap change operation represented by at least one power loss waveform.

9 Claims, 8 Drawing Sheets

(56) References Cited

U.S. PATENT DOCUMENTS

| | | | |
|---|---|---|---|
| 2013/0282312 A1 | 10/2013 | Abeywickrama et al. | |
| 2019/0195933 A1* | 6/2019 | Bengtsson | H01F 38/14 |

OTHER PUBLICATIONS

Chinese Office Action and English Translation, Chinese Patent Application No. 2023800221730, mailed May 1, 2025, 14 pages.

* cited by examiner

MONITORING A TRANSFORMER COMPRISING A TAP CHANGER

CROSS-REFERENCE TO RELATED APPLICATIONS

This application is a 35 U.S.C. § 371 national stage application of PCT International Application No. PCT/EP2023/053131 filed on Feb. 8, 2023, which in turn claims priority to European Patent Application No. 22157343.9, filed on Feb. 17, 2022, the disclosures and content of which are incorporated by reference herein in their entireties.

FIELD OF INVENTION

The present disclosure relates to a monitoring device, method and computer program product for monitoring a transformer comprising a tap changer.

BACKGROUND

Transformers equipped with tap changers are frequently used in different types of power transmission environments, such as at 10 kiloVolt (kV) and above. A transformer that comprises a tap changer is able to change the turns ratio between the windings to thereby change voltage levels. This ability is in many systems used for controlling the delivery of power.

Transformers are generally reliable. The probability of them failing is low, such as around 1%. However, of those 1% that fail, typically 20-40% are due to failure in the tap changer.

The reason for this is that the tap changer is the only part of the transformer that has mechanically moving elements. Therefore, this part of the transformer is more likely to cause a failure than the rest of the transformer.

When monitoring a transformer it is therefore of interest to monitor a tap change operation when the turns ratio is changed. If such monitoring is performed then it may be possible to identify tap changer faults and worn parts at an early stage. Thereby maintenance may be more easily planned, which is of advantage both with regard to reliability and economy.

U.S. Pat. No. 10,473,707 (FIG. 3) discloses methods for extracting operation duration time (ODT), i.e. circulating current time, and amplitude (AMP) relating to a tap change operation using a monitoring device comprising a waveform recorder and a waveform analyzer. The waveform analyzer comprises a power loss handling block, a current difference handling block and a frequency domain processing block.

The transformer is monitored with regard to the operation of the tap changer, for instance through analyzing the changes of the operation duration time and amplitude in tap change "pulses" over time. It is possible to determine the health of the tap changer and thereby also the health of the transformer with this information.

Moreover, these general measurement quantities are not always easy to use. As can be seen in FIG. 3, it is possible to obtain information that can be used for tap changer monitoring purposes, for instance based on power loss. However, FIG. 3 shows the power loss at low loads. If the transformer experiences a high load, then it is not that easy to extract the information indicative of tap changer performance from the available measured waveforms as FIG. 3 would seem to suggest. There should be side "pulses" in the waveform, associated with load current passing through transition impedance(s). The amplitude of such side "pulses" is dependent on the load current and may therefore be smaller, equal or larger than the amplitude of the main "pulse". Thus, the extraction of information related to the main "pulse" and/or side "pulses" is not always possible by the methods disclosed in the prior art.

It is of interest to monitor a transformer equipped with a tap changer in a way that information indicating the performance of tap changer functions can be extracted using the available waveforms for condition monitoring purposes with the same reliability at all loads.

The present disclosure is directed towards such an improved transformer monitoring.

SUMMARY OF THE INVENTION

The present disclosure is thus directed towards improved monitoring of a transformer with regard to a tap changer operation.

This object is, according to a first aspect of the present disclosure, achieved through a method for monitoring a transformer comprising a tap changer. The transformer has at least two magnetically coupled windings and the tap changer comprises at least one impedance element and a switch configured to gradually pass a load current through at least one impedance element when changing between two tap changer positions during a tap change operation. The method is performed in a monitoring device and comprises the steps of obtaining waveforms of measured current recorded at the first and second transformer sides. Processing the recorded waveforms for obtaining at least one current difference waveform representing a tap change operation, wherein the processing of recorded waveforms comprises obtaining a first current deviation waveform and a second current deviation waveform. The method further comprises the steps of refining the current difference waveform by adding the first current deviation waveform to the second current deviation waveform and removing a steady component based on load current and extracting information indicative of the health of the tap changer from said at least one waveform that represents the tap change operation. The extracted information comprises a circulating current time covering at least a part of the tap change operation determined from a circulating current start time and a circulating current end time of the tap change operation. The extracted information may also comprise a circulating current amplitude of said at least one waveform representing the tap change operation.

Circulating current may appear as a main "pulse" in the waveform. Refining the current difference waveform by adding the first current deviation waveform to the second current deviation waveform and removing a steady component based on load current, is used to extract both the circulating current time and the circulating current amplitude. The refined circulating current analysis method is an improvement over the prior art as it provides only one "pulse" associated with the circulating current with well-defined rising and falling edges, which is independent of the load current. Other methods, such as power loss monitoring, may not be able to discern the "pulse" associated with the circulating current during high loads. The observed amplitude of the circulating current can be compared to a nominal value obtained from the impedance value and the voltage tap step. The improved parameters, like circulating current time and circulating current amplitude, can be used to better plan maintenance of the transformer and can give more reliable information about specific components of the tap changer.

The improved accuracy of the parameters results in fewer false alarms when monitoring the tap changer.

According to a second aspect of the present disclosure, the object is achieved through a method for monitoring a transformer comprising a tap changer. The transformer has at least two magnetically coupled windings and the tap changer comprises at least one impedance element and a switch configured to gradually pass a load current through the at least one impedance element when changing between two tap changer positions during a tap change operation. The method is performed in a protection device and comprises the steps of obtaining waveforms of measured current and voltages recorded at the first and second transformer sides and processing the recorded waveforms for obtaining at least one current difference waveform and at least one power loss waveform, each representing a tap change operation. The processing of recorded waveforms further comprises extracting a circulating current start time and a circulating current end time from the at least one current difference waveform representing a tap change operation and extracting a tap change start time and a tap change end time from the at least one power loss waveform representing a tap change operation. The method further comprises determining at least one transition current time and at least one circulating current time using the circulating current start time and the circulating current end time, the tap change start time and a tap change end time and extracting information indicative of the health of the tap changer from said at least one current difference waveform and said at least one power loss waveform, each representing a tap change operation. The extracted information comprises a circulating current amplitude and/or a circulating current time covering at least a part of the tap change operation represented by said at least one current difference waveform, and/or a transition current time covering at least a part of the tap change operation represented by said at least one power loss waveform.

The second embodiment combines a known power loss difference analysis with a known current difference analysis. The combination allows detection and extraction of transition current time which appears as side "pulses" before and/or after the circulating current "pulse". The transition current time provides timing information about a part of the tap change operation when the at least one impedance element conducts current. For instance, in a vacuum-type tap changer example mentioned above, a significantly shorter transition current time may indicate that main side vacuum bottles have not opened. It is also possible to detect arcing in the transition current time by studying the obtained waveforms.

Optionally, processing the recorded waveforms further comprises refining the current difference waveform by adding the first current deviation waveform to the second current deviation waveform and removing a steady component based on load current.

Hereby, the known power loss analysis is combined with the improved current difference method of the first embodiment, as outlined above, enabling monitoring of previously unavailable properties of the tap changer, such as the health of impedance elements and occurrence of arcing during the tap change operation.

According to a third aspect of the disclosure, the object is achieved through a monitoring device for monitoring a transformer comprising a tap changer. The transformer having at least two magnetically coupled windings arranged at a first and a second transformer side and the tap changer comprises at least one impedance element and a switch configured to gradually pass a load current through the at least one impedance element when changing between two tap changer positions during a tap change operation. The monitoring device comprises a waveform analyzer operative to monitor the transformer according to any of the steps of the method outlined above.

According to a fourth aspect of the disclosure, the object is achieved through a computer program product comprising program code to cause the waveform analyzer above to execute any of the steps of the method outlined above.

According to a fifth aspect of the disclosure, the object is achieved through a computer readable medium having stored thereon the computer program product above.

BRIEF DESCRIPTION OF THE DRAWINGS

The present disclosure will in the following be described with reference being made to the accompanying drawings, where.

DETAILED DESCRIPTION OF THE INVENTION

In the following, a detailed description of embodiments of aspects of the present disclosure will be given.

Figure 1:
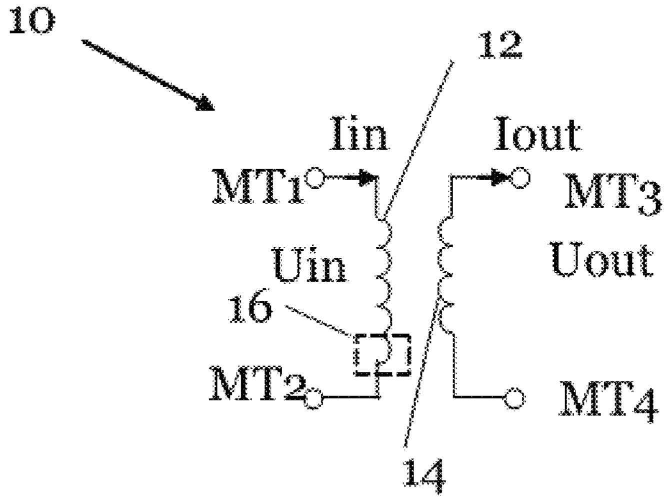
FIG. 1 schematically shows a transformer equipped with a tap changer.

FIG. 1 shows a transformer 10 having a first winding 12 and a second winding 14 magnetically coupled to each other. These windings thus form a pair, often denoted primary and secondary windings. The first winding 12 is furthermore connected to a tap changer 16. In the figure there are also shown a number of power transmission properties of the transformer that may be measured during operation. There is an input current In fed into and input voltage Uin applied over the first winding 12. There is also an output current Iout delivered from and an output voltage Uout provided by the second winding 14. The input current In and the input voltage Uin are measurement quantities that are measured at a first and a second measurement terminal MT1 and MT2 of the first winding 12, where the first measurement terminal MT1 is provided at a first end of the first winding 12 and the second measurement terminal MT2 at a second end of the first winding 12. The output current Iout and the output voltage Uout are measurement quantities measured at a third and a fourth measurement terminal MT3 and MT4 of the second winding 14, where the third measurement terminal MT3 is provided at a first end and the fourth measurement terminal MT4 is provided at a second end of the second winding 14. It can thus be seen that electric power enters and exits the transformer at the measurement terminals. The above-described example assumes a power transfer through the transformer from the first to the second winding. Thereby the first winding 12 forms an input side and the second winding an output side of the transformer 10. However, it should be realized that power may be transferred in the opposite direction, in which case the input current and input voltage would be measured at the third and fourth measurement terminals MT3 and MT4, while the output current and output voltage would be measured at the first and second measurement terminals MT1, and MT2. Then the second winding 14 would form the input side and the first winding 12 would form the output side. The measurement quantities are therefore also power transmission properties that are measured at the measurement terminals.

The transformer shown is schematically represented. It should be realized that it may also comprise an iron core. It should also be realized that a transformer in many cases is a three-phase transformer. This means that there would be three pairs of windings. A transformer may also comprise more than one secondary winding magnetically coupled to the same primary winding. The tap changer may as an alternative also be connected to the second winding. The transformer may also be a three-phase transformer configured as a system of single-phaser transformers, where each single-phase transformer is connected to a corresponding tap changer.

Figure 2:
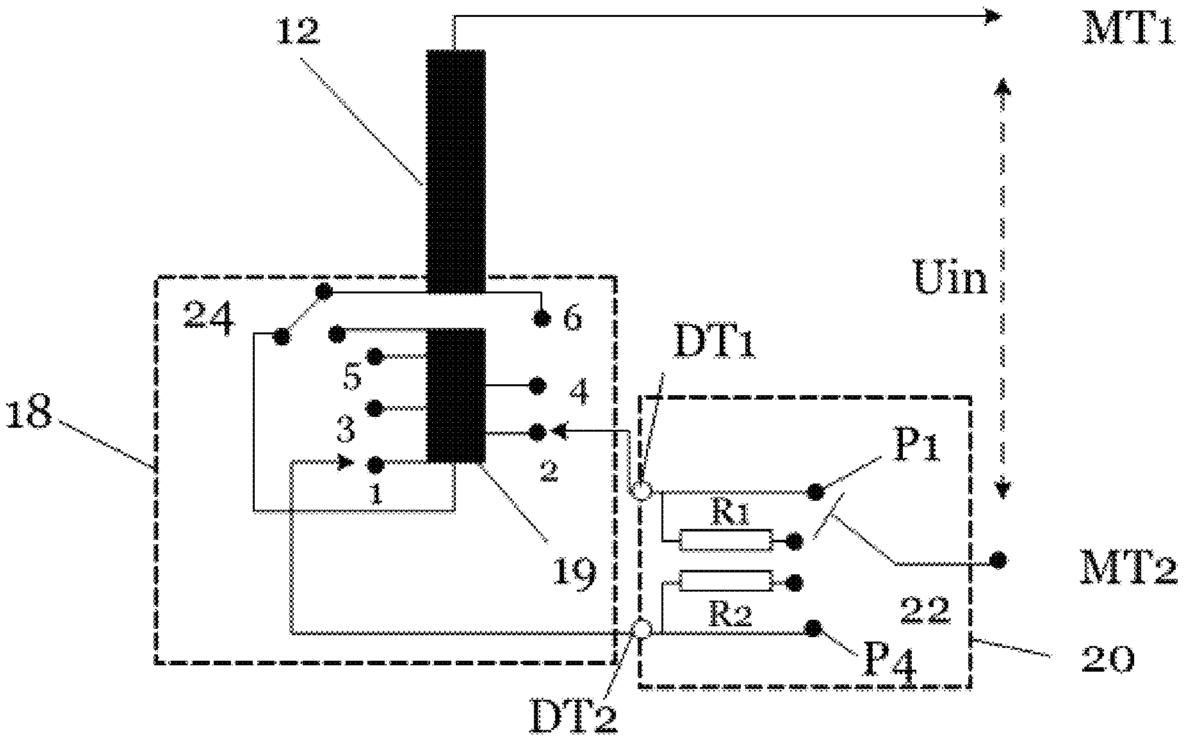
FIG. 2 schematically shows the tap changer and one winding of the transformer in FIG. 1.

FIG. 2 schematically shows the first winding 12 together with a tap changer that comprises a regulating winding 19. The first winding has a first and a second end, with the first end connected to the first measurement terminal MT1 and the second end connectable to the regulating winding 19. The regulating winding 19 also has a first and a second end. The tap changer furthermore comprises a diverter 20 and a selector 18 that selects a number of turns of the regulating winding 19 that are to be connected to the primary winding 12.

The selector 18 has a selector switch 24 that is used to reverse the orientation of the regulating winding 19 and therefore has a first end connected to the second end of the first winding 12 and a second end moveable between two positions, a first position at the first end of the regulating winding 19 and a second position at the second end of the regulating winding 19. Each winding 12 and 19 comprises a number of turns of electrical conductor. Furthermore, the regulating winding 19 comprises a number of tap points of which six 1 2, 3, 4, 5 and 6 are shown as an example. The tap points are used for determining how many turns of the regulating winding 19 that are to be connected to the first winding 12 by a first selector arm connected to a first diverter terminal DT1 and a second selector arm connected to a second diverter terminal DT2.

The diverter 20 in turn comprises a diverter switch 22 with a first end connected to the second measurement terminal MT2 and a second end that is connectable between four contact positions, where a first contact position P1 leads to the first diverter terminal DT1 via a first diverter arm, a second contact position leads to the first diverter terminal DT1 via an impedance element in the form of a first resistor R1, a third contact position leads to the second diverter terminal DT2 via an impedance element in the form of a second resistor R2 and a fourth contact position P4 leads directly to the second diverter terminal DT2 via a second diverter arm. The diverter 20 is provided for commutating a load between the two selector arms.

It should here be realized that this is merely one realization of a selector and diverter tap changer. There exist several other types of selectors and diverter tap changers. There also exist other types of tap changers. Another type is for instance a selector-switch tap changer, which combines the selection and commutation in one movement but have a similar contacting sequence as the selector and diverter tap changer. Yet another example is a vacuum tap changer, where the contact sequence often is modified but still includes a time when power is lost in impedance elements. The shown tap changer also comprises resistors as impedance element. However, it is also known to use other types of impedance elements, such as inductors. Furthermore, in the shown tap changer there are two impedance elements. It should be realized that it is also possible with fewer, such as one, or even more, such as three or four.

What is common for all these tap changers is that during a tap change there is gradual movement of a switch between two positions, which in the case of the tap changer in FIG. 2 is the diverter switch 22 moving between the first and fourth positions P1 and P4. When a tap change is desired one of the selector arms is originally connected between a tap position and the corresponding diverter terminal. As an example the first selector arm may be connected between the second tap position 2 shown in FIG. 2 and the first diverter terminal DT1 and at the same time the diverter switch 22 is in the first contact position P1. Thereby the first selector arm is loaded, i.e. a load current thus passes through the first diverter arm and into the first selector arm. A tap position that obtains a desired turns ratio change is then selected for the non-loaded selector arm, which in this example is the second selector arm. The second diverter terminal DT2 therefore connects the unloaded second selector arm to the selected tap position, which in the example of FIG. 2 is the first tap position 1. In order to commutate the load, i.e. to carry out the change of the turns ratio, the diverter switch 22 is then gradually moved from the first to the fourth contact position. In this gradual movement the diverter switch 22 first establishes contact with the first resistor R1 at the same time as there is contact with the first contact position P1. Then the diverter switch 22 breaks the contact with the first contact position P1 and the first diverter arm. The load current will now only run through the first resistor R1 to the first selector arm. Thereafter the diverter switch connects to the second resistor R2. At this point in time the load current will run through both the resistors R1 and R2 to both the first and second selector arms. There will also be a circulating current that is generated through the voltage difference between the diverter terminals DT1 and DT2. This is followed by the diverter switch 22 breaking the connection with the first resistor R1 and thereby load current is only running through the second resistor R2 to the second selector arm. Finally the diverter switch will reach the fourth contact position P4 and then the load current will run through the second diverter arm to the second selector arm. Thereby the tap change operation is completed. It can be seen that during such a movement energy is loaded or deposited into at least one impedance element and in the example of FIG. 2 in two resistors R1 and R2, which energy is consumed in the case of a resistor but only temporarily stored in the case of an inductor. The load current is thus gradually passed through the first resistor R1 and second resistor R2 by the movement of the switch 22.

Through the above-mentioned operation of the tap changer in FIG. 2, i.e. during the gradual change between the positions P1 and P4, the impedances R1 and R2 will be connected between the measurement terminals MT3 and MT4 and therefore energy will be deposited in them. In the present example real power is lost, since the impedances are resistors. If the impedances were inductive then reactive power would instead be stored.

The instantaneous power loss may for instance be determined according to equation (1) below $$P_{loss}(t) = P^{in}(t) - P^{out}(t) = \sum\nolimits_{phases} \left(V^{in}(t)I^{in}(t) - V^{out}(t)I^{out}(t)\right) \quad (1)$$

The equation, which is provided for a three-phase system, thereby defines the power loss of a three-phase transformer. The instantaneous power loss Ploss is thus calculated based on the power transmission property measurements obtained at the first, second, third and fourth measurement terminals MT1, MT2, MT3 and MT4 as the input voltage Uin times the input current In minus the output voltage Uout times the output current Iout, where three such differences are obtained, one for each phase.

It is possible to obtain the real power loss from equation (1) as an average of the instantaneous power loss in a period and the reactive power loss as an oscillation with an average of zero.

Figure 3:
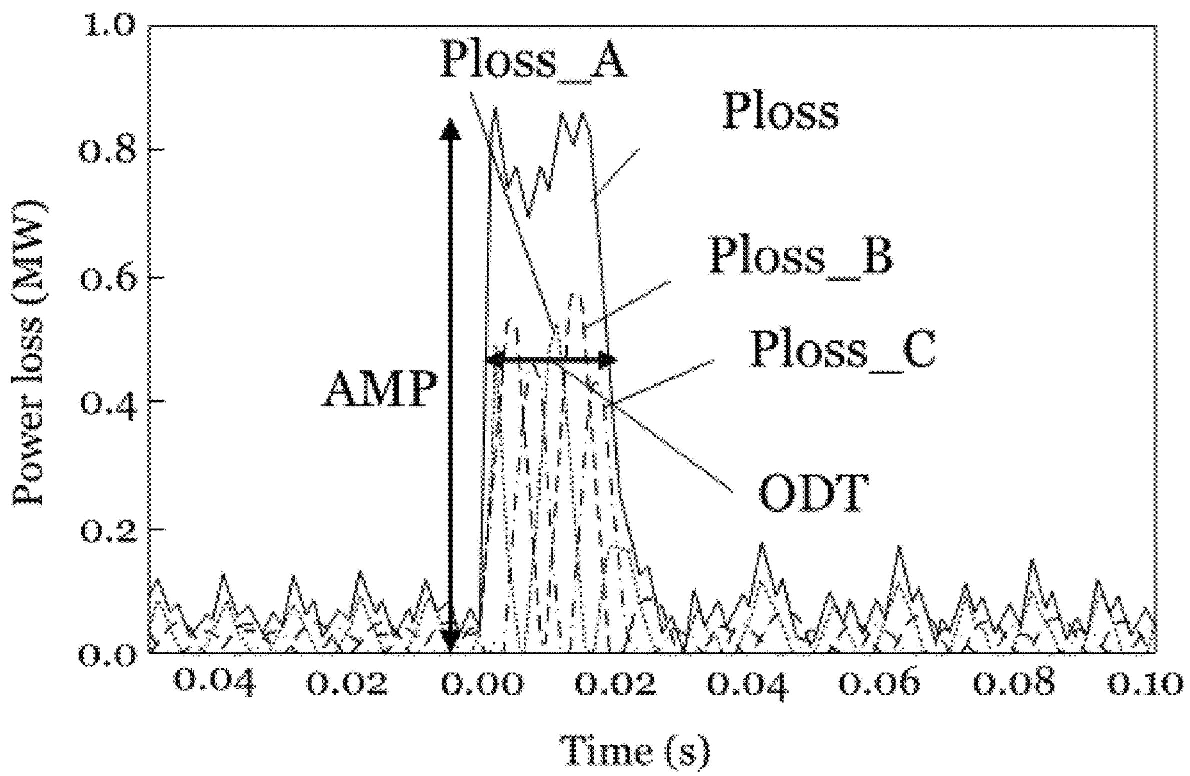
FIG. 3 (Prior Art)
FIG. 3 shows a prior art representation of power loss in the transformer occurring during a tap change operation at very low or no load operation, FIG. 4 schematically shows a waveform recorder together with a waveform analyzer for monitoring the transformer.

The way power loss appears at a low load of such a three-phase transformer equipped with tap changer can be seen in FIG. 3. In the figure there is shown the power loss for each phase through a concerted tap change operation in all three phases. There is a power Ploss_A in a first phase, a power loss Ploss_B in a second phase and a power loss Ploss_C in a third phase. These three power losses are furthermore summed up to a total power loss Ploss, and the total power loss Ploss has the shape of a "pulse". In the figure it can be seen that the tap changing operation is carried out between times 0.00 and 0.02 s. It can be seen that the "pulse" or this interval as an example has a width of 20 ms and the width is a peak duration time of an energy deposition or a peak duration energy deposition time and in this interval, each phase experiences power loss. In the prior art method illustrated by FIG. 3, this peak duration time is termed an operation duration time ODT between a rising edge and a falling edge of the "pulse" because the time duration corresponds to the duration of at least some steps in the operation of the tap changer. It thus covers at least a part of the tap change operation. It can more particularly be seen that the operation duration time ODT corresponds to the time that the diverter switch 22 is solely connected to the resistors R1 and R2. It can also be seen that the power loss during the tap changer operation has an amplitude AMP. The amplitude and operation duration time ODT are examples of information that is indicative of tap changer performance or tap changer health, is obtainable via recorded waveforms and can be used for monitoring purposes. In the present disclosure, the operation duration time ODT corresponds to the circulating current time $t_C$. In the present disclosure, the amplitude AMP corresponds to the circulating current amplitude $A_C$.

Transformers are generally reliable. The probability of them failing is low, such as around 1% per year. However, of the 1% that fail, typically 20-40% are due to failure in the tap changer.

As mentioned above the only moving elements of a transformer are included in the tap changer. It can thereby be seen that the tap changer is relevant to the reliability.

If the transformer is monitored with regard to the operation of the tap changer, for instance through analyzing the changes of the circulating current time and amplitude in tap change "pulses" over time, it is possible to determine the health of the tap changer and thereby also the health of the transformer. This can be used to better plan maintenance of the transformer. A too short commutation time may be risky due to the fact that possible arcs are most reliably quenched at current zero crossings. This means that the circulating current time should be longer than half a period. If the arc is able to survive the operation there will be a short circuiting of the regulating windings, which will in turn develop a lot of energy and may cause the transformer to break down. A too short circulating current time may thus correspond to a failed tap changer. On the other hand, too long commutation times indicate that there is friction in the system but no indication of breakdown. A long circulating current time is thus an indication that service is needed because long commutation times generate more heat for e.g. resistor tap changers which may affect the transformer's general performance, such as reduced power. It may be an indication that more cooling is needed. Through monitoring the changes in the circulating current time it is thereby possible to predict when a failure would occur as well as to plan service of the transformer. The amplitude in turn indicates the size of the resistance. If the amplitude changes then the resistance changes. Furthermore, a high amplitude corresponds to a small resistance and a low amplitude to a high resistance. The amplitude may be of importance if no "pulse" can be seen at all, which would mean that either the tap changer has not moved or that the resistance is close to infinity, i.e. that the resistor is broken. Both these situations are important fault cases, where the latter may give rise to arcs that short-circuit the regulating winding.

Further, load current passing through one or more involved transition impedance elements (resistors) can create a power loss proportional to the square of the load current and appear as an additional loss "pulse" right before or after the power loss "pulse" associated with the circulating current. Such "pulses" adjacent to each other indicates one or more time information pieces of the operation sequence. With prior art methods, these transition impedance losses may be difficult to separately identify at significantly higher loads.

There is also a problem in that it is not possible to directly monitor the tap changer. Transformers do not normally have any measurement quantities that are directly related to the tap changing operation. The monitoring of the health of the transformer with regard to the tap changer would therefore have to be made using general transformer measurement quantities, such as input/output currents and voltages.

Moreover, these general measurement quantities are not always that easy to use. As can be seen in FIG. 3 it is possible to obtain information that can be used for tap changer monitoring purposes, for instance based on power loss.

The aim of the present disclosure is to improve on prior art and to provide a method of extracting more information based on current difference monitoring and power loss monitoring, using a monitoring device.

Figure 4:
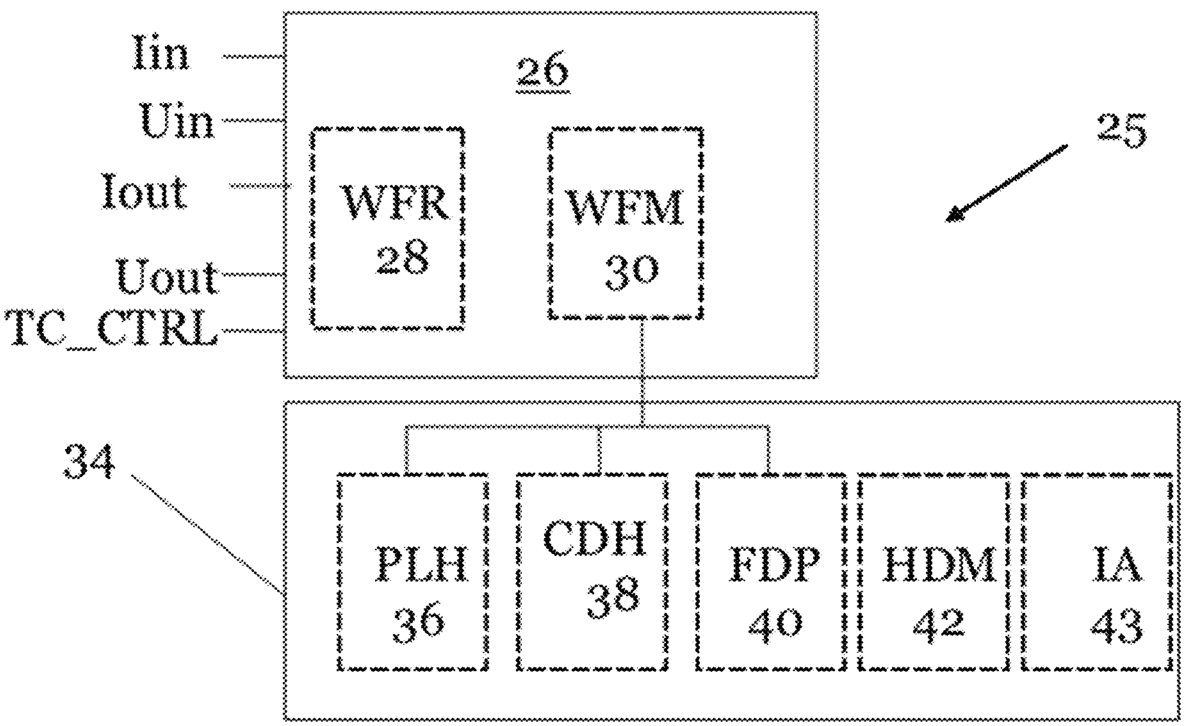

One way of realizing a monitoring device 25 is shown in FIG. 4. The monitoring device 25 comprises a waveform recorder 26, which comprises a waveform recording block WFR 28 that receives measurement quantities of the transformer in the form of the measured power transmission properties In, Uin, Iout and Oout as well as a tap changer control signal TC_CTRL, which is a control signal sent to the tap changer in order to effectuate or start a tap change operation. Such a control signal is typically sent from a tap changer control unit, which as an example may be associated with power control of a power transmission system. The waveform recorder 26 also comprises a waveform memory WFM 30 in which recorded waveforms are stored. When the tap changer control signal TC_CTRL is obtained by the waveform recorder 26, the waveform recording block 28 records a number of waveforms of the input and output currents and input and output voltages (if available) and stores these in the waveform memory 30. The obtaining or reception of the tap changer control signal TC_CTRL thus triggers the recording of waveforms, which recording then continues for a pre-determined time, such as for 10 seconds. This has the advantage of providing waveforms that clearly coincide with a tap changer operation. Furthermore, the length is such that it safely allows waveform prediction to be made. Also the control signal typically precedes the actual tap change operation such that a reliable prediction of a steady state operational waveform may be made.

The monitoring device 25 also comprises a waveform analyzer 34, which comprises a power loss handling block PLH 36, a current difference handling block CDH 38 and, optionally, a frequency domain processing block FDP 40. Each of these blocks provide a separate way of obtaining at least one waveform from which it is possible to extract information indicative of a tap change. Finally, the waveform analyzer 34 comprises an information analyzing block IA 43 and a health data memory HDM 42 in which (time stamped) waveforms and/or (time stamped) tap changer performance indication information are stored for condition monitoring purposes.

The waveform analyser 34 may be implemented through a computer or a processor with associated program memory comprising computer instructions implementing the above-described blocks. It may also be realized through one or more dedicated components such as Application Specific Integrated Circuits (ASICSs) or Field Programmable Gate Arrays (FPGAs) realizing the blocks. It should also be realized that the waveform analyzer sometimes only needs to comprise one of the power loss handling block 36, current difference handling block 38 and frequency domain processing block 40. It should also be realized that it is possible that the information analyzing block 43 is omitted and its functionality provided in another entity such as a separate monitoring computer.

The realization of a waveform recorder 26 is as such known, but may in some respects also be realized in the same way as the waveform analyser 34. It may however also comprise Analog/Digital (A/D) converters and possibly also scaling units for scaling at least some of the received signals.

Figure 9:
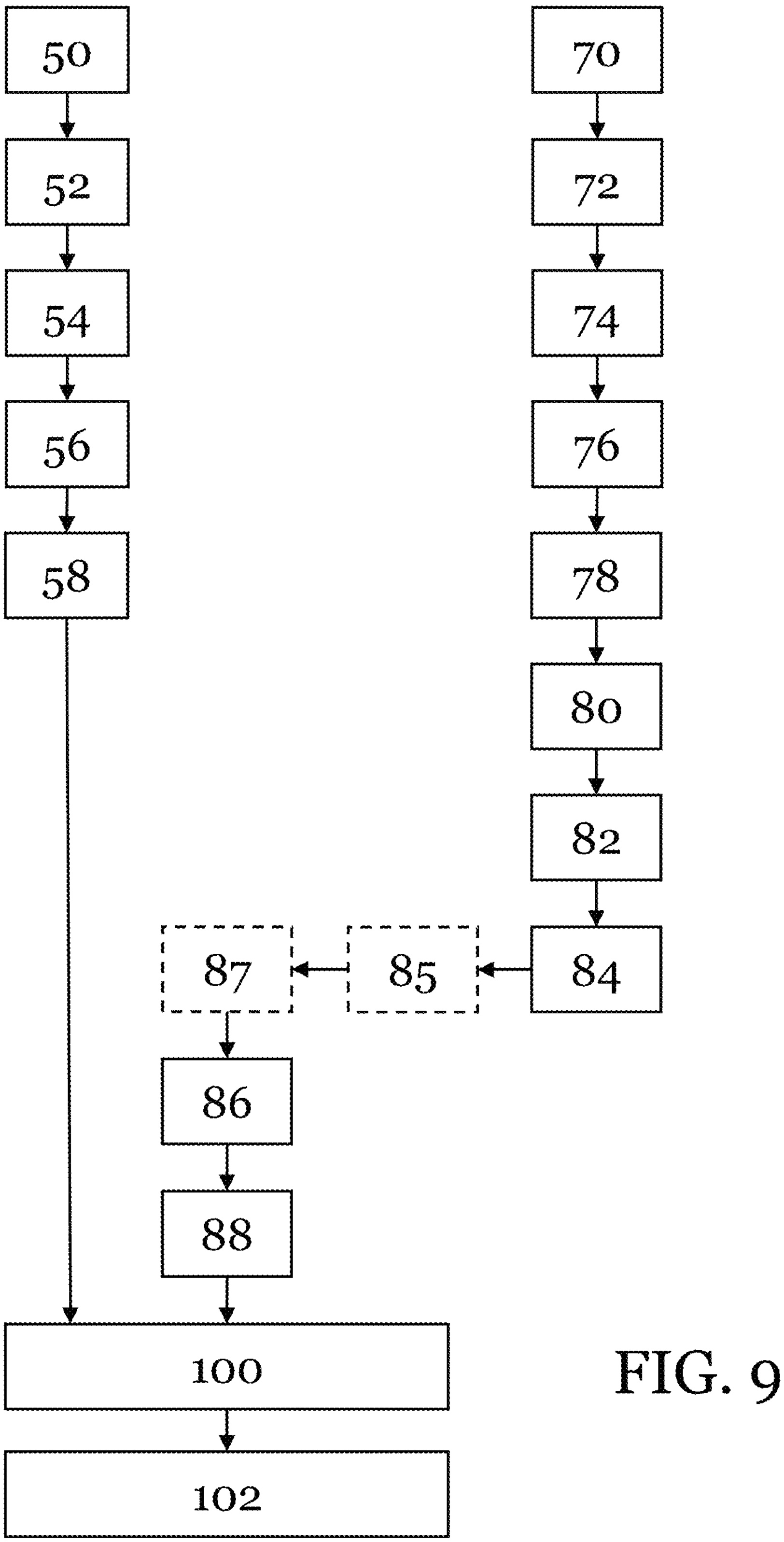
FIG. 9 shows a flow chart of method steps in a second, and optionally a third, embodiment of the method of monitoring the transformer being performed by the power loss handling block and the current difference handling block in the waveform analyzer.

One way of operating the waveform analyzer 26 in order to monitor the transformer 10 will now be described with reference also being made to FIG. 5, which shows a block schematic of the power loss handling block 36 and to FIG. 6, which shows a flow chart of a number of method steps in a prior art method of monitoring the transformer 10 performed in the power loss handling block 36. The prior art method of FIG. 6 is part of the inventive concept of the present disclosure and is in FIG. 6 shown as an isolated method only for easier understanding of the improved method of the present disclosure, which is illustrated in FIG. 9.

The power loss handling block 36 comprises a power loss determining element PLD 44, a power loss predicting element PLP 46, a power loss waveforming element PLWF 48 and a waveform analyzing element WFA 49.

As was mentioned above, the waveform recorder 26 records the waveforms that appear at the measurement terminals when there is a tap change operation triggered by the tap changer control signal TC_CTRL, which waveforms are stored in the waveform memory 30.

The recorded waveforms also have a start point and an end point.

In order to obtain a waveform that is indicative of the performance of a tap change, the power loss determining element 44 of the power loss handling block 36 first obtains the recorded waveforms In, Uin, Iout and Uout from the waveform memory 30 of the waveform recorder 26, step 50, which are thus the waveforms of power transmission properties recorded at the first and second transformer sides.

Thereafter the power loss handling block processes the recorded waveforms for obtaining at least one waveform representing a tap change operation.

The processing here involves the processing of a difference between a power transmission property on both sides of the transformer using the measured power transmission properties. The power transmission property in question here is the derived property of power and the difference between the two sides is the power loss through the transformer expressed as a power loss waveform. The processing furthermore involves predicting at least one waveform of the same type as the difference waveform and obtaining each waveform representing the tap change operation as a difference between the difference waveform and the corresponding predicted waveform, where there is one predicted waveform and one difference waveform.

Therefore, the determining element 44 determines the power loss of the transformer using the input and output current In, Uin, Iout and Oout waveforms, step 52. The power loss may in this case be determined in the way shown in equation (1) above.

At the same time, the power loss predicting element 46 predicts the same power loss, step 54.

This prediction may comprise a prediction of the stationary waveforms of current and voltage on the first and second sides of the transformer 10. Each such signal Uin, In, Uout, Iout may be predicted from earlier observations through generating a spectrum from an oscillating signal and extracting the important frequency amplitudes. From these amplitudes the waveform at future times can be predicted. The prediction method is described in more detail in U.S. Pat. No. 8,095,326, which is herein incorporated by reference.

The predicted waveforms may therefore correspond to stationary waveforms of the currents and voltages at the first and second sides of the transformer, i.e. waveforms without any embedded tap change information. These predicted waveforms may then be used in the forming of a predicted power loss, step 54.

Figure 10:
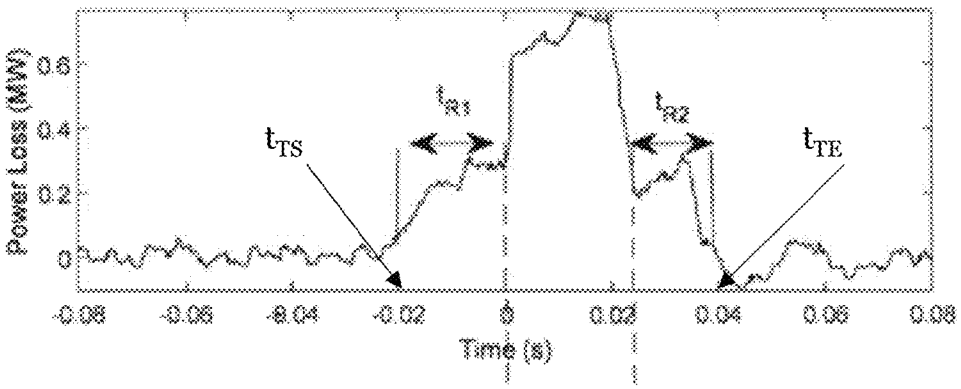
FIGS. 10-11 show a representation of parameter extraction, according to the present disclosure, with regard to power loss and current difference in the transformer occurring during a tap change operation comprising two impedance elements.
Figure 12:
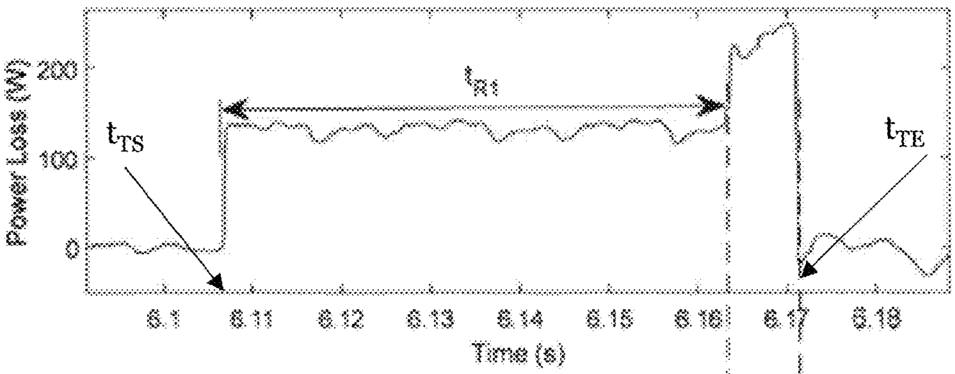
FIGS. 12-13 show a representation of parameter extraction, according to the present disclosure, with regard to power loss and current difference in the transformer occurring during a tap change operation comprising one impedance element.

Thereafter the power loss waveforming element 48 determines the difference between the determined and predicted power loss for obtaining a power deviation waveform defining the tap change operation, step 56. The difference is then used as a waveform that defines the tap change operation. As mentioned above the prediction of power loss would represent the steady state power loss without the tap change operation. Therefore, in such a difference waveform essentially only the previously shown "pulse" of FIG. 3 should be present and thereby the information indicative of tap change performance can be easily extracted from the waveform. Power loss difference waveforms derived from the power loss method are also shown in FIG. 10 and FIG. 12.

The difference may as an example be obtained as $$\Delta P_{loss}(t) = P_{loss}(t) - P_{loss}^{pred}(t) \tag{2}$$

One way in which this may be done is through $$\Delta P_{loss}(t) = \sum\nolimits_{phases} V_i(t)\Delta I_i(t) + \Delta V_i(t)I_i(t) + \Delta V_i(t)\Delta I_i(t) \tag{3}$$

Equation (3) shows a determination of an input or output power change, where i thus encodes input or output side and ΔI and ΔV are the differences between predicted and actual current and voltage waveforms.

The power loss difference between actual and predicted power loss will then be:

$$\Delta P_{loss}(t) - \Delta P_{in}(t) - \Delta P_{out}(t) \tag{4}$$

Thereby the steady state components have been removed and the result is a waveform that represents the tap change operation and that in essence only comprises the power loss due to the tap change operation. In this waveform, shown in FIG. 10 and FIG. 12, it is then easy to determine a tap change start time $t_{TS}$ and a tap change end time $t_{TE}$, and thereby determine the total width of the tap change operation, for instance through identifying the time between the rising edge and the falling edge in the waveform, step 58, as well as the amplitude $A_C$, step 60, which determinations may be performed by the waveform analyzing element 49. The information indicative of the performance of the tap change operation, i.e. the amplitude $A_C$, the tap change start time and tap change end time, may then be stored, possibly time stamped, together with the power loss difference waveform, in the health data memory 42 for use in condition monitoring of the transformer, step 62. In this regard also other information may be stored, such as initial and final tap positions, load currents etc.

Health determination and predictions may then be performed by the information analyzing block 43. The information analyzing block 43 may thus analyze the information indicative of tap change operation that is stored in the memory 42 by the waveform analyzing element 49, estimate the wear of the transformer and determine when maintenance is to be made or rather determine at which service window the transformer is to be replaced or serviced. As an alternative it is possible that the power loss analyzing element 49 is omitted and the power loss waveforming element 48 stores the power loss difference waveform in the health data memory 42. In this case the information analyzing block 43 may instead obtain the power loss difference waveform from the health data memory 42 and extract the information indicative of tap change operation therefrom when determining the health of the transformer.

The above-described method of obtaining the start time and end time of the tap change operation does not in itself allow extraction of other parameters of interest, such as the transition current time, which can be used to monitor the impedance elements. A first embodiment of the present is an improved current difference method, using measured current as input and comparing measured current with predicted current.

Figures 7, 8:
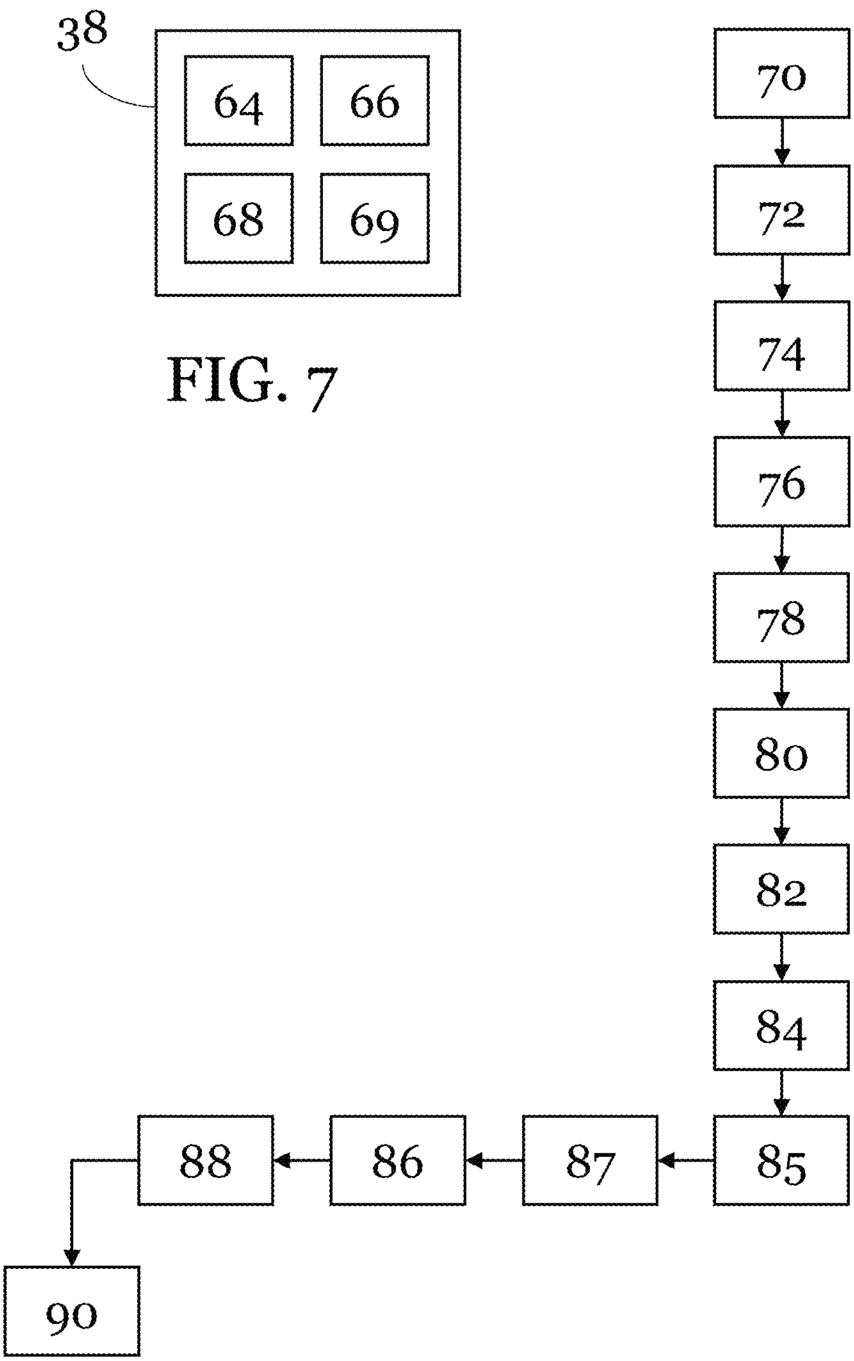
FIG. 7 shows a block schematic of a current difference handling block in the waveform analyzer.
FIG. 8 shows a flow chart of method steps in a first embodiment of the method of monitoring the transformer being performed by the current difference handling block in the waveform analyzer.

This first embodiment will now be described with reference being made to FIGS. 7 and 8, where FIG. 7 shows a block schematic of the current difference handling block 38 and FIG. 8 shows a flow chart of a number of method steps in the method of monitoring the transformer and being performed by the current difference handling block 38.

The current difference handling block 38 comprises a current difference determining element CDD 64, a current difference predicting element CDP 66, a current deviation waveform determining element CDWF 68 and a current difference analyzing element 69.

Figure 11:
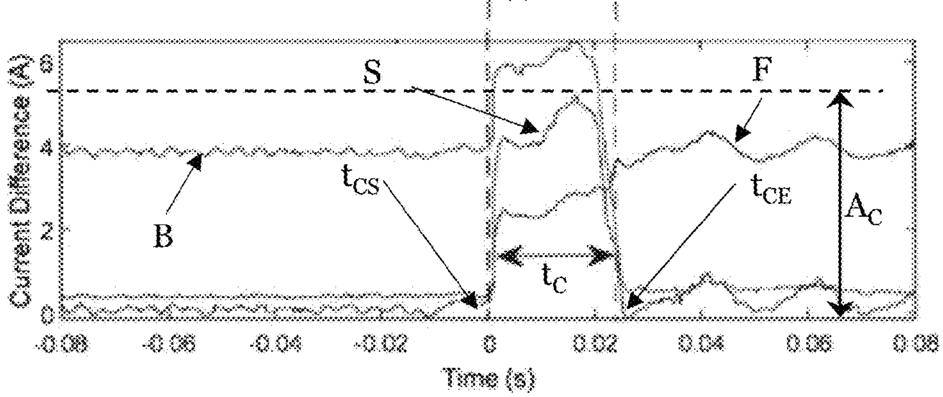

Similar to the prior art power loss difference described above, in the first embodiment, there is processing of a difference between a power transmission property on both sides of the transformer using the measured power transmission properties. In this first embodiment the power transmission property in question is the measured power transmission property of current and the difference between the two sides is the current difference between the two sides. The processing involves predicting waveforms of the same type as the difference waveform, i.e. predicting current difference waveforms. The processing also comprises obtaining each waveform representing the tap change operation as a difference between the difference waveform and the corresponding predicted waveform. In this first embodiment two waveforms are predicted, one forward in time and one backwards in time from the difference waveform and the obtaining of at least one waveform comprises obtaining two deviation waveforms; one as a difference between the difference waveform and a first of the predicted waveforms and another as a difference between the difference waveform and a second of the predicted waveforms. According to this first embodiment, the two deviation waveforms are added, and a steady component based on the load current is removed. See FIGS. 11 and 13, where FIG. 11 shows the current deviation waveforms B, F and the resulting waveform S, whereas FIG. 13 only shows the resulting waveform S. The steady component is at a level of approximately 4 amperes in FIG. 11. From the resulting waveform S, the circulating current time $t_C$ and the amplitude may be determined. The steady component may be described as $$\sqrt{\frac{3}{2}} \times \Delta n \times \text{Load Current},$$

where Δn is the ratio change between two taps, e.g., 0.0167.

In order to obtain the at least one waveform that is indicative of the performance of the tap changer, the current difference determining element 66 of the current difference handling block 38 first obtains the recorded waveforms In and Iout of all phases from the waveform memory of the waveform recorder 26, step 70, where the waveforms of the measured power transmission properties in this embodiment only comprise current waveforms recorded at the first and second transformer sides.

Thereafter the current difference determining element 64 determines a current difference Idiff between the currents on the two sides of the transformer, step 72.

The current difference may be based on the determining of partial current differences for the different phases.

For a phase p, the corresponding partial current difference may be obtained as $$I_p^{diff}(t) = I_p^{in}(t) - \frac{I_p^{out}(t)}{n_p^e} \tag{5}$$

where $$n_p^e$$

is an effective ratio of the specific phase that is obtained using a Discrete Fourier Transformation (DFT) calculation of the current amplitudes and depends on the turns ratio and a current sensor calibration error.

The total current difference for all phases may thereafter be determined as:

$$I_{sum}^{diff}(t) = \sqrt{(I_1^{diff}(t))^2 + (I_2^{diff}(t))^2 + (I_3^{diff}(t))^2} \tag{6}$$

It is possible to make predictions of the current differences using the same above-described prediction technique described above. However, it should be noted that in case the transformer comprises for instance three connected single-phase transformers, each provided with a tap changer, or a three-phase transformer with more than one tap changer, expression (6) may not be used for determining the total current difference for all phases. Instead, the current difference waveforms are individually analyzed.

In this embodiment the current difference predicting element 66 predicts a first difference current. The prediction may be made based on the same equations (5) and (6) above that have been modified in line with equations (2) and (3). Furthermore, the prediction is in this case made in the forward direction starting from the beginning of the waveform and towards the end of the recording, step 74.

The current deviation waveform determining element 68 then obtains or determines a first current deviation waveform as the difference between the actual and first predicted current difference waveforms, step 76. In this waveform it is then possible for the current difference analyzing element 69 to detect the start of the tap change operation, step 78, for instance through detecting a rising edge or high positive time derivative of the waveform. It is also possible for it to detect an amplitude. However, the present first embodiment offers an improved method of detecting the rising edge and amplitude, as described below.

However, the end of the tap change operation is not as easy to detect using the first current deviation waveform because the stationary waveforms have been changed after a turn ratio change by the tap operation. Therefore, in order to detect the end of tap change operation the current difference predicting element 66 predicts a second current difference in the backward direction, i.e. starting at the end of the waveform recording and going backwards in time, step 80.

This is followed by the current deviation waveform determining element 68 obtaining or determining a second current deviation waveform as the difference between the actual and second predicted current difference waveforms, step 82. In this waveform it is then possible for the current difference analyzing element 69 to detect the end of the tap change operation, step 84, for instance through detecting a falling edge or large negative time derivative of the waveform. Also here it is possible to estimate the amplitude.

The present first embodiment offers an improved method of determining the pulse width, i.e. the circulating current time $t_C$. By adding 85 the first current deviation waveform to the second current deviation waveform and removing 87 a steady component based on the load current, it is possible for the current difference analyzing element 69 to determine the "pulse" width of the circulating current, i.e. the circulating current time $t_C$, more accurately. Further, by removing the steady component based on the load current and dividing by two, the amplitude may be obtained more accurately compared to prior art as there is only one well-defined "pulse" left after the improvement.

FIG. 11 shows an example of a flag cycle tap changer with two resistors R1 and R2 and illustrates how the first current deviation waveform F and the second current deviation waveform B are added and the steady component based on load current is removed, resulting in the waveform S, from which the circulating current time ($t_C$) covering at least a part of the tap change operation may be extracted. It is determined from the circulating current start time ($t_{CS}$) and the circulating current end time ($t_{CE}$) of the tap change operation, as shown in FIG. 11 . . . . As obvious in FIG. 11, neither the first current deviation waveform F nor and the second current deviation waveform B provides an accurate estimate of the current amplitude ($A_C$), and it is even not possible to extract the amplitude from the first current deviation waveform F. This is a significant improvement over the prior art.

Figure 13:
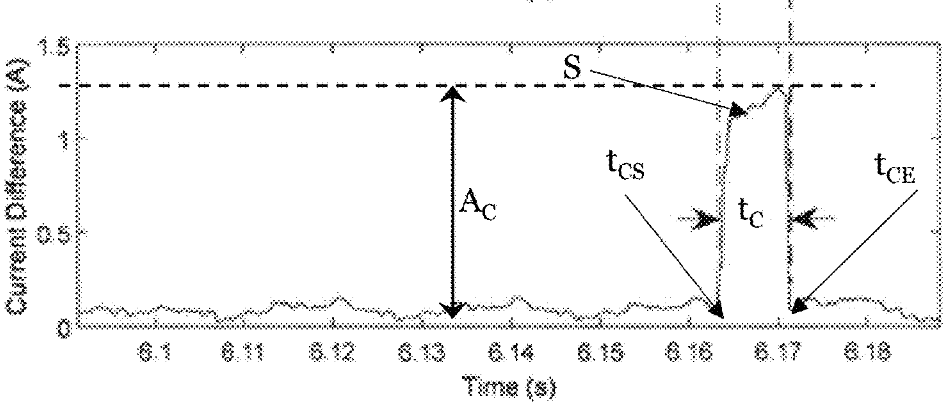

FIG. 13 shows an example of a pennant cycle tap changer with one resistor R1 monitored by the current difference method of the first embodiment.

The current difference analyzing element 69 is able to determine the "pulse" width or circulating current time, step 86, from the start and end, i.e. the rise and fall, respectively, of the circulating current "pulse". The amplitude may be determined or obtained 88 by looking at the height of the circulating current "pulse".

The information indicative of tap change performance may then be extracted and stored 90, possibly time stamped, in the health data memory 42. Also here other information may be stored, such as initial and final tap positions, load currents etc. It is also possible that the current deviation waveform determining element 66 stores the first and second current deviation waveforms in the memory 42.

The information analyzing block 43 may thereafter analyze the stored information and/or waveforms for condition monitoring purposes. Also here it is possible that the information analyzing block 43 extracts the tap change performance indication information from the sum of the current deviation waveforms if this has not already been done.

The first embodiment is thus an improvement over prior art current difference methods, where more accurate and detailed results are obtained.

The described embodiment relies on concerted tap change operation in the three phases. However, for some tap changer installations, most notably when there are three separate tap changers, one for each phase, the tap change operation of the different phases may not be concerted. The tap change operation may thus be performed independently of each other in the different phases. Therefore, it may be necessary to monitor the transformer with regard to a tap change operation separately for the three phases. As mentioned above, expression (6) is therefore not applicable for such transformers.

In a second embodiment, the above-described power loss difference method is combined with either the conventional current difference method, or with the improved current difference method of the first embodiment described hereinabove, resulting in an improved method of monitoring a tap changer. The combined method is illustrated in FIG. 9 and involves the power loss difference steps and the current difference steps being carried out in parallel, and where the results are combined to obtain additional monitoring information, especially information relating to the at least one impedance element R.

In FIG. 9, the steps of the first embodiment are shown with dashed lines as optional steps. Using the conventional current difference method, the two current deviation waveforms are not summed, and the steady component of the current is not removed. Instead, the pulse width is determined 86 through combining the two current deviation waveforms, e.g. by determining the start time $t_{CS}$ and end time $t_{CE}$ of the "pulse". Through looking at any of the current deviation waveforms also the amplitude may be determined or obtained, step 88.

The method according to the second embodiment thus relates to monitoring a transformer 10 comprising the tap changer 16. The transformer has at least two magnetically coupled windings 12, 14. The tap changer 16 further comprises at least one impedance elements R and a switch 22 configured to gradually pass a load current through the at least one impedance element R when changing between two tap changer positions P1, P4 during the tap change operation. The method is performed in a monitoring device 25 and comprises obtaining 50, 70 waveforms of measured current and voltages Iin, Uin, Iout, Uout recorded at the first and second transformer sides, and processing 52, 54, 56; 72, 74, 76, 78 the recorded waveforms for obtaining at least one current difference waveform and at least one power loss waveform, each representing a tap change operation.

The processing of recorded waveforms further comprises determining 86, 88 a circulating current start time ($t_{CS}$), a circulating current end time ($t_{CE}$) and a circulating current amplitude $A_C$ from the at least one current difference waveform representing a tap change operation, such as a circulating current time, and extracting a tap change start time ($t_{TS}$) and a tap change end time ($t_{TE}$) from the at least one power loss waveform representing a tap change operation, such as a total tap change duration time, and determining 100 at least one transition current time ($t_R$) and at least one circulating current time ($t_C$) using the circulating current start time ($t_{CS}$) and the circulating current end time ($t_{CE}$), the tap change start time ($t_{TS}$) and a tap change end time ($t_{TE}$) and extracting (102) information ($t_C$, $A_C$, $t_R$) indicative of the health of the tap change from said at least one current difference waveform and said at least one power loss waveform, each representing a tap change operation, wherein the extracted information comprises a circulating current amplitude $A_C$ and/or a circulating current time ($t_C$) covering at least a part of the tap change operation represented by said at least one current difference waveform, and/or at least one transition current time $t_R$ covering at least a part of the tap change operation represented by said at least one power loss waveform.

From the power loss deviation waveform, the waveform analyzing element 49 may thus determine 58 the total tap change operation time through the width of the power loss deviation waveform, for instance through identifying the tap change start time $t_{TS}$ from the rising edge in the waveform and the tap change end time $t_{TE}$ from the falling edge in the waveform.

By combining the extracted data from the power loss method and the current loss method, one or more transition current times $t_R$ and circulating current time, may be determined as intervals. A transition current time $t_R$ appearing as a "pulse" to the left of the circulating current "pulse" may be determined as an interval between the tap change start time $t_{TS}$ and the circulating current start time $t_{CS}$. [[ ]] A transition current time appearing as a "pulse" to the right of the circulating current "pulse" may be determined as an interval between the circulating current end time $t_{CE}$ and the tap change end time $t_{TE}$. Further, the circulating current time $t_C$ is determined as the interval between the circulating current start time $t_{CS}$ and the circulating current end time $t_{CE}$.

Information $t_C$, $A_C$, $t_R$ indicative of the health or performance of the tap change may be extracted 102 from said at least one current difference waveform and said at least one power loss waveform.

The information indicative of the performance of the tap change operation, i.e. the circulating current amplitude $A_C$, the circulating current time $t_C$ and/or at least one transition current time $t_R$ may then be extracted and stored 102, possibly time stamped, together with the power loss difference waveform, in the health data memory 42 for use in condition monitoring of the transformer. In this regard also other information may be stored, such as initial and final tap positions, load currents etc.

Health determination and predictions may then be performed by the information analyzing block 43. The information analyzing block 43 may thus analyze the information $t_C$, $A_C$, $t_R$ indicative of tap change operation that is stored in the memory 42 by the waveform analyzing element 49, 69 estimate the wear of the transformer/tap changer and determine when maintenance is to be made or rather determine at which service window the transformer is to be replaced or serviced.

It can in this way be seen that it is possible to identify a tap change operation as well as to extract new tap change performance indication information relating to the transition current time which is extracted from the side "pulses" of the power loss waveform as well as the circulating current time extracted from the current difference waveform irrespective of the size of the load. Thereby the planning of maintenance may be improved.

In short, it can be seen that an improved monitoring of a transformer equipped with a tap changer is obtained, where it is possible to evaluate the performance of the tap changer. Thereby a more reliable maintenance planning can be made. This is also done without the need for dedicated tap changer monitoring sensors but only using measurement quantities that are traditionally available for a transformer. In this way the improved monitoring is obtained using a minimum of additional hardware and also without introduction of additional sensors and retrofitting of waveform recorders.

The method according to the second embodiment may optionally be refined by the current difference method according to the first embodiment, wherein the processing of the recorded waveforms further comprises refining the current difference waveform by adding 85 the first current deviation waveform to the second current deviation waveform and removing 87 a steady component based on load current.

Figure 5:
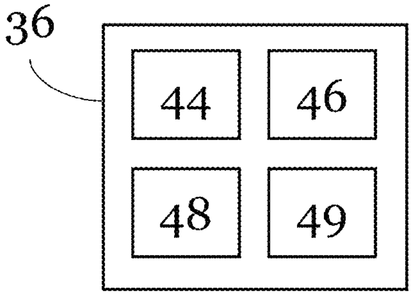
FIG. 5 shows a block schematic of a power loss handling block in the waveform analyzer.
Figure 6:
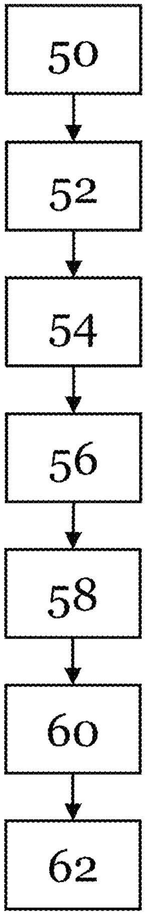
FIG. 6 (Prior Art)
FIG. 6 shows a flow chart of prior art method steps of a method of monitoring the transformer being performed by the power loss handling block in the waveform analyzer.

Although not detailed in the description of the second embodiment above, the determination of the two current deviation waveforms and the power loss deviation waveform follow the same steps as previously described in conjunction with the description of the power loss method shown in FIGS. 5 and 6 and the description of the current difference method of the first embodiment shown in FIGS. 7 and 8.

There are a number of variations that may be made apart from those already described. It is for instance possible that the monitoring device only comprises the waveform analyzer that is set to communicate with the waveform recorder. It is also possible that the monitoring device is provided as a part of an Intelligent Electronic Device (IED) provided for the transformer.

FIG. 10 illustrates how the circulating current start time $t_{CS}$ and the circulating current end time $t_{CE}$ of the current difference method are used with tap change start time $t_{TS}$ and the tap change end time $t_{TE}$ of the power loss difference waveform to determine a first transition current time $t_{R1}$ and a second transition current time $t_{R2}$. The transition currents are shown as "pulses" to the left and right of the circulating current "pulse".

FIG. 12 illustrates the method used on a pennant cycle tap changer, having a single transition impedance R1.

Figure 14:
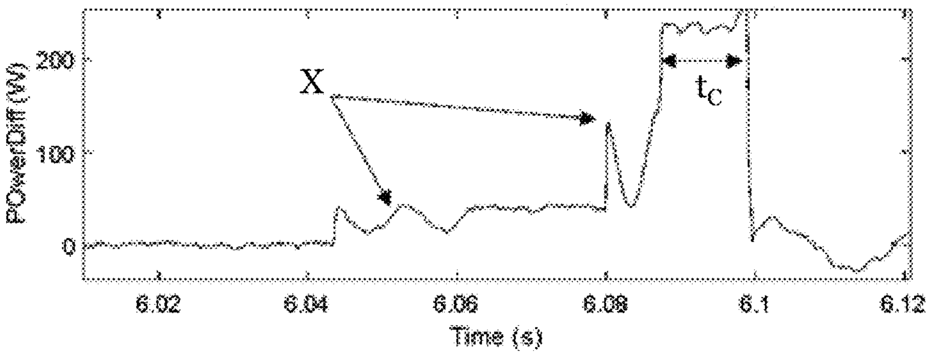
FIGS. 14-15 show a representation of further feature extraction based on the embodiments of the present disclosure.
Figure 15:
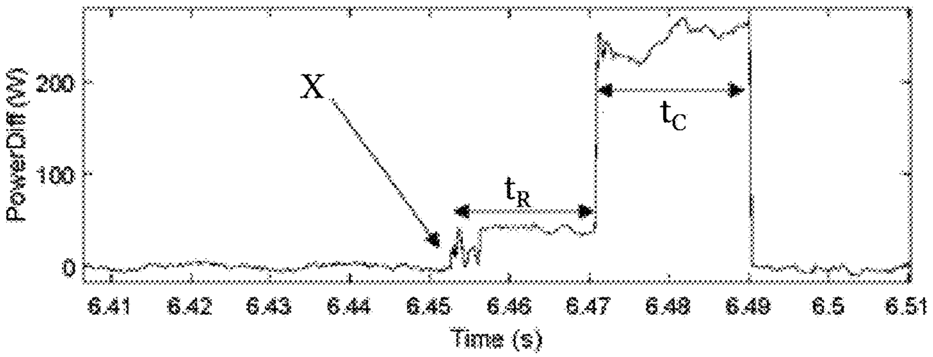

FIGS. 14 and 15 show problematic tap change operations that are visible in the obtained power loss difference waveforms. FIG. 14 illustrates how deviations X are detected in the pennant cycle tap changer, as monitored in FIGS. 12 and 13. In FIG. 14 a main side vacuum bottle, on one phase, does not open. $t_C$ is close to the nominal expected time. In FIG. 15, the main side vacuum bottle on all phases do not open, resulting in a transition current time tri which is much shorter than expected and a circulating current time $t_C$ which is longer than expected, as it starts earlier compared to a normal operation.

The waveform analyzer may be realized in the form of discrete components. However, it may also be implemented in the form of a processor with accompanying program memory comprising computer program code that performs the desired control functionality when being run on the processor. A computer program product carrying this code can be provided as a data carrier such as one or more CD ROM discs, a hard disk storage or one or more memory sticks carrying the computer program code, which performs the above-described waveform analyzer functionality when being loaded into a waveform analyzer.

From the foregoing discussion it is evident that aspects of the present disclosure can be varied in a multitude of ways. It shall consequently be realized that aspects of the present disclosure is only to be limited by the following claims.

The invention claimed is:

1. A method for monitoring a transformer comprising a tap changer, said transformer having at least two magnetically coupled windings and the tap changer comprising at least one impedance element and a switch configured to gradually pass a load current through the at least one impedance element when changing between two tap changer positions during a tap change operation, the method being performed in a monitoring device and comprising:

obtaining, from a waveform memory of a waveform recorder, a plurality of waveforms of measured current recorded by the waveform recorder at a first and second transformer sides;

based on the recorded waveforms, generating, by a current difference handling block of the monitoring device, at least one current difference waveform representing a tap change operation, wherein the generating of the at least one current difference waveform comprises obtaining, by the current difference handling block of the monitoring device, a first current deviation waveform and a second current deviation waveform, wherein the obtaining of the first current deviation waveform and the second current deviation waveform further comprises determining, by the current difference handling block of the monitoring device, a current difference waveform that sets out a difference between the current on the two sides of the transformer based on the measured current, generating, by the current difference handling block of the monitoring device, a first predicted current waveform, forward in time, and a second predicted current waveform, backwards in time, from the current difference waveform, and generating, by the current difference handling block of the monitoring device, the first current deviation waveform as a difference between the difference waveform and the first predicted current waveform and the second current deviation waveform as a difference between the difference waveform and the second predicted current waveform;

refining, by the current difference handling block of the monitoring device, the current difference waveform by adding the first current deviation waveform to the second current deviation waveform and removing a steady component based on load current;

extracting, by the monitoring device, information indicative of the health of the tap changer from said at least one waveform that represents the tap change operation, wherein the extracted information comprises a circulating current time covering at least a part of the tap change operation and determined from a circulating current start time and a circulating current end time of the tap change operation, and/or a circulating current amplitude of said at least one waveform representing the tap change operation;

storing, in a memory, the information indicative of the health of the tap changer; and analyzing, by an information analyzing block of the monitoring device, the extracted information to estimate wear of the tap changer and, based on the estimated wear, determining, by the information analyzing block of the monitoring device, a service window for performing maintenance.

2. The method of claim 1, wherein the refining the current difference waveform by adding the first current deviation waveform to the second current deviation waveform and removing a steady component based on load current causes a pulse in the current difference waveform to comprise a defined rising edge and a defined falling edge in the waveform when the transformer is under high load.

3. A method for monitoring a transformer comprising a tap changer, said transformer having at least two magnetically coupled windings and the tap changer comprising at least one impedance element and a switch configured to gradually pass a load current through the at least one impedance element when changing between two tap changer positions during a tap change operation, the method being performed in a monitoring device and comprising:

obtaining, from a waveform memory of a waveform recorder, waveforms of measured current and voltages recorded at a first and second transformer sides;

processing, by a current difference handling block of the monitoring device, the recorded waveforms for obtaining at least one current difference waveform and at least one power loss waveform, each representing a tap change operation, wherein the processing of recorded waveforms further comprises:

determining, by the current difference handling block of the monitoring device, a circulating current start time, a circulating current end time and circulating current amplitude from the at least one current difference waveform representing a tap change operation, wherein determining the circulating current start time and the circulating current end time comprises processing, by the current difference handling block of the monitoring device, the recorded waveforms and obtaining a first current deviation waveform and a second current deviation waveform from the current difference waveform, and wherein obtaining the first current deviation waveform and the second current deviation waveform further comprises determining, by the current difference handling block of the monitoring device, a current difference waveform that sets out a difference between the current on the two sides of the transformer based on the measured current, predicting a first predicted current waveform, forward in time, and a second predicted current waveform, backwards in time, from the current difference waveform, obtaining the first current deviation waveform as a difference between the difference waveform and the first predicted current waveforms and obtaining the second current deviation waveform as a difference between the difference waveform and the second predicted current waveform; and extracting, by the monitoring device, a tap change start time and a tap change end time from the at least one power loss waveform representing a tap change operation, and determining, by the monitoring device, at least one transition current time and at least one circulating current time using the circulating current start time and the circulating current end time, the tap change start time and a tap change end time and extracting, by the monitoring device, information indicative of the health of the tap change from said at least one current difference waveform and said at least one power loss waveform, each representing a tap change operation, wherein the extracted information comprises a circulating current amplitude and/or a circulating current time covering at least a part of the tap change operation represented by said at least one current difference waveform, and/or a transition current time covering at least a part of the tap change operation represented by said at least one power loss waveform; and analyzing, by an information analyzing block of the monitoring device, the extracted information to estimate wear of the tap changer and, based on the estimated wear, determining by the information analyzing block of the monitoring device, a service window for performing maintenance.

4. The method according to claim 3, wherein the circulating current start time is extracted as the start of the first current deviation waveform, and the circulating current end time is extracted as the end of the second current deviation waveform.

5. The method according to claim 4, wherein processing the recorded waveforms further comprises refining the current difference waveform by adding the first current deviation waveform to the second current deviation waveform and removing a steady component based on load current.

6. The method according to claim 3, wherein processing the recorded waveforms for obtaining the at least one power loss waveform representing a tap change operation further comprises determining a power loss difference waveform that sets out a difference between the power on the two sides of the transformer based on the measured current and voltages predicting a predicted power waveform obtaining a power deviation waveform as a difference between the power loss difference waveform and the predicted power waveform.

7. A monitoring device for monitoring a transformer comprising a tap changer, said transformer having at least two magnetically coupled windings arranged at a first and a second transformer side and the tap changer comprising at least one impedance element and a switch configured to gradually pass load current through the at least one impedance element when changing between two tap changer positions during a tap change operation, the monitoring device comprising a waveform analyzer comprising:

a waveform recorder comprising a waveform memory;

a current difference handling block;

a memory; and an information analyzing block, the waveform analyzer operative to:

obtain, from the waveform memory of the waveform recorder, a plurality of waveforms of measured current recorded by the waveform recorder at a first and second transformer sides;

based on the recorded waveforms, generate, by the current difference handling block of the monitoring device, at least one current difference waveform representing a tap change operation, wherein the generating of the at least one current difference waveform comprises obtaining, by the current difference handling block of the monitoring device, a first current deviation waveform and a second current deviation waveform, wherein the obtaining of the first current deviation waveform and the second current deviation waveform further comprises determining, by the current difference handling block of the monitoring device, a current difference waveform that sets out a difference between the current on the two sides of the transformer based on the measured current, generating, by the current difference handling block of the monitoring device, a first predicted current waveform, forward in time, and a second predicted current waveform, backwards in time, from the current difference waveform, and generating, by the current difference handling block of the monitoring device, the first current deviation waveform as a difference between the difference waveform and the first predicted current waveform and the second current deviation waveform as a difference between the difference waveform and the second predicted current waveform;

refine, by the current difference handling block of the monitoring device, the current difference waveform by adding the first current deviation waveform to the second current deviation waveform and removing a steady component based on load current;

extract, by the monitoring device, information indicative of the health of the tap changer from said at least one waveform that represents the tap change operation, wherein the extracted information comprises a circulating current time covering at least a part of the tap change operation and determined from a circulating current start time and a circulating current end time of the tap change operation, and/or a circulating current amplitude of said at least one waveform representing the tap change operation;

store, in the memory, the information indicative of the health of the tap changer; and analyze, by the information analyzing block of the monitoring device, the extracted information to estimate wear of the tap changer and, based on the estimated wear, determine, by the information analyzing block of the monitoring device, a service window for performing maintenance.

8. A computer program product comprising program code stored on a non-transitory computer readable medium which, when the program code is executed by a processor of a waveform analyzer, causes the waveform analyzer to execute a method for monitoring a transformer comprising a tap changer, said transformer having at least two magnetically coupled windings and the tap changer comprising at least one impedance element and a switch configured to gradually pass a load current through the at least one impedance element when changing between two tap changer positions during a tap change operation, the method being performed in a monitoring device and comprising:

obtaining, from a waveform memory of a waveform recorder, a plurality of waveforms of measured current recorded by the waveform recorder at a first and second transformer sides;

based on the recorded waveforms, generating, by a current difference handling block of the monitoring device, at least one current difference waveform representing a tap change operation, wherein the generating of the at least one current difference waveform comprises obtaining, by the current difference handling block of the monitoring device, a first current deviation waveform and a second current deviation waveform, wherein the obtaining of the first current deviation waveform and the second current deviation waveform further comprises determining, by the current difference handling block of the monitoring device, a current difference waveform that sets out a difference between the current on the two sides of the transformer based on the measured current, generating, by the current difference handling block of the monitoring device, a first predicted current waveform, forward in time, and a second predicted current waveform, backwards in time, from the current difference waveform, and generating, by the current difference handling block of the monitoring device, the first current deviation waveform as a difference between the difference waveform and the first predicted current waveform and the second current deviation waveform as a difference between the difference waveform and the second predicted current waveform;

refining, by the current difference handling block of the monitoring device, the current difference waveform by adding the first current deviation waveform to the second current deviation waveform and removing a steady component based on load current;

extracting, by the monitoring device, information indicative of the health of the tap changer from said at least one waveform that represents the tap change operation, wherein the extracted information comprises a circulating current time covering at least a part of the tap change operation and determined from a circulating current start time and a circulating current end time of the tap change operation, and/or a circulating current amplitude of said at least one waveform representing the tap change operation;

storing, in a memory, the information indicative of the health of the tap changer; and analyzing, by an information analyzing block of the monitoring device, the extracted information to estimate wear of the tap changer and, based on the estimated wear, determining, by the information analyzing block of the monitoring device, a service window for performing maintenance.

9. A non-transitory computer readable medium having stored thereon computer-executable instructions that, when executed by a processor of a waveform analyzer comprising a waveform analyzer, a current difference handling block, a memory, and an information analyzing block, causes the waveform analyzer to perform operations comprising:

obtaining, from a waveform memory of a waveform recorder, waveforms of measured current recorded at a first and second transformer sides of a transformer, wherein the transformer includes a tap changer;

processing, by the current difference handling block, the recorded waveforms for obtaining at least one current difference waveform representing a tap change operation, wherein the processing of recorded waveforms comprises obtaining a first current deviation waveform and a second current deviation waveform, wherein the obtaining of the first current deviation waveform and the second current deviation waveform further comprises determining a current difference waveform that sets out a difference between the current on the two sides of the transformer based on the measured current, predicting a first predicted current waveform, forward in time, and a second predicted current waveform, backwards in time, from the current difference waveform, and obtaining the first current deviation waveform as a difference between the difference waveform and the first predicted current waveform and the second current deviation waveform as a difference between the difference waveform and the second predicted current waveform;

refining, by the current difference handling block, the current difference waveform by adding the first current deviation waveform to the second current deviation waveform and removing a steady component based on load current;

extracting, by a monitoring device, information indicative of the health of the tap changer from said at least one waveform that represents the tap change operation, wherein the extracted information comprises a circulating current time covering at least a part of the tap change operation and determined from a circulating current start time and a circulating current end time of the tap change operation, and/or a circulating current amplitude of said at least one waveform representing the tap change operation;

storing, in the memory, the information indicative of the health of the tap changer; and analyzing, by the information analyzing block, the extracted information to estimate wear of the tap changer and, based on the estimated wear, determining a service window for performing maintenance.

* * * * *